United States Patent
Lin et al.

(10) Patent No.: US 8,680,609 B2
(45) Date of Patent: Mar. 25, 2014

(54) DEPLETION MODE SEMICONDUCTOR DEVICE WITH TRENCH GATE AND MANUFACTURING METHOD THEREOF

(75) Inventors: Wei-Chieh Lin, Hsinchu (TW); Jia-Fu Lin, Yilan County (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 147 days.

(21) Appl. No.: 13/091,160

(22) Filed: Apr. 21, 2011

(65) Prior Publication Data
US 2012/0139037 A1     Jun. 7, 2012

(30) Foreign Application Priority Data
Dec. 2, 2010 (TW) ................ 99141893 A (51) Int. Cl.
*H01L 29/76* (2006.01)

(52) U.S. Cl.
USPC ........... 257/330; 257/332; 257/348; 257/402; 257/E29.201; 438/257; 438/270

(58) Field of Classification Search
USPC .......... 257/284, 330, 332, 348, 402; 438/259, 438/270
See application file for complete search history.

(56) References Cited

U.S. PATENT DOCUMENTS

| | | | |
|---|---|---|---|
| 5,786,619 A | 7/1998 | Kinzer | |
| 5,869,864 A * | 2/1999 | Tihanyi | 257/335 |
| 6,165,822 A | 12/2000 | Okuno | |
| 2009/0200559 A1 | 8/2009 | Suzuki | |

FOREIGN PATENT DOCUMENTS

TW    201041132    11/2010

* cited by examiner

*Primary Examiner* — Thanh V Pham
(74) *Attorney, Agent, or Firm* — Winston Hsu; Scott Margo (57) ABSTRACT

A manufacturing method of a depletion mode trench semiconductor device includes following steps. Firstly, a substrate including a drift epitaxial layer disposed thereon is provided. A trench is disposed in the drift epitaxial layer. A gate dielectric layer is formed on an inner sidewall of the trench and an upper surface of the drift epitaxial layer. A base doped region is formed in the drift epitaxial layer and adjacent to a side of the trench. A thin doped region is formed and conformally contacts the gate dielectric layer. A gate material layer is formed to fill the trench. A source doped region is formed in the base doped region, and the source doped region overlaps the thin doped region at a side of the trench. Finally, a contact doped region is formed to overlap the thin doped region, and the contact doped region is adjacent to the source doped region.

10 Claims, 9 Drawing Sheets

DEPLETION MODE SEMICONDUCTOR DEVICE WITH TRENCH GATE AND MANUFACTURING METHOD THEREOF

BACKGROUND OF THE INVENTION

1. Field of the Invention

The present invention relates to a depletion mode semiconductor device and a manufacturing method thereof, and more particularly, to a depletion mode semiconductor device with a trench gate and a manufacturing method thereof.

2. Description of the Prior Art

Generally, transistors include enhancement mode transistors and depletion mode transistors. In the depletion mode transistor, the channel may exist without voltages applied to the gate electrode by modifying the doping concentration in the channel. A negative voltage has to be applied to the gate electrode to close the channel in the depletion mode transistor. Therefore, the depletion mode transistor is a kind of normally-closed transistor, and in contrary, the enhancement mode transistor is a kind of normally-open transistor.

The depletion mode transistor may be constructed by a horizontal structure or by a vertical structure. The electrical capacitance is relatively lower and the operation speed is relatively higher in the depletion mode transistor constructed by the horizontal structure. Higher breakdown voltages and higher integrated density could be realized with the depletion mode transistor constructed by the vertical structure.

As smaller electric devices are continually developed, the distance between each of the devices in the transistor keeps on getting smaller. For instance, in the depletion mode transistor constructed by the vertical structure, the distance between the source electrode and the drain electrode becomes smaller, or the depths of the source electrode and the drain electrode become shallow. The modification approach for reducing the volume of the electric device may lower the resistance of the electric device but also may induce the punch through effect in the depletion mode transistor.

SUMMARY OF THE INVENTION

It is one of the objectives of the present invention to provide a depletion mode trench semiconductor device and a manufacturing method thereof for improving the problems of the conventional technology.

The present invention provides a depletion mode trench semiconductor device. The depletion mode trench semiconductor device includes a substrate, a drift epitaxial layer, a base doped region, a trench gate structure, a source doped region, a contact doped region, an inversion layer, a dielectric layer, and a source conductive line. The substrate has a first type conductivity. The drift epitaxial layer has the first type conductivity, and the drift epitaxial layer is disposed on the substrate. The base doped region has a second type conductivity, and the base doped region is disposed in the drift epitaxial layer. The trench gate structure is disposed in the drift epitaxial layer and on a side of the base doped region. The source doped region has the first type conductivity, and the source doped region is disposed in the base doped region and adjacent to the trench gate structure. The contact doped region has the second type conductivity, and the contact doped region is disposed in the base doped region and adjacent to the source doped region. The inversion layer has the first type conductivity, and the inversion layer is disposed in the base doped region and contacts a part of the trench gate structure. The dielectric layer covers the trench gate structure. The source conductive line electrically connects with the source doped region and the contact doped region.

The present invention further provides a manufacturing method of a depletion mode trench semiconductor device. The manufacturing method of the depletion mode trench semiconductor device includes following steps. Firstly, a substrate having a first type conductivity is provided. A drift epitaxial layer is disposed on the substrate, and a trench is disposed in the drift epitaxial layer. A gate dielectric layer is formed on an inner sidewall of the trench and an upper surface of the drift epitaxial layer. A sacrificial layer is formed to fill the trench. A base doped region is formed in the drift epitaxial layer and adjacent to a side of the trench. The base doped region has a second type conductivity. The sacrificial layer is then removed. A thin doped region is formed in the drift epitaxial layer and the base doped region. The thin doped region conformally contacts the gate dielectric layer. A gate material layer is formed to fill the trench. A source doped region is formed in the base doped region, and the source doped region overlaps the thin doped region at a side of the trench. Finally, a contact doped region is formed to overlap the thin doped region, and the contact doped region is adjacent to the source doped region.

In the present invention, the trench gate structure is employed in the depletion mode semiconductor device for enhancing the integrated density, and the inversion layer on the sidewalls of the trench gate structure may be used to prevent the punch through effect. Additionally, the base doped region may not be effected by over diffusion, which may be generated by thermal processes for the gate dielectric layer, because the base doped region is formed after the gate dielectric layer.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-6 are schematic diagrams illustrating the manufacturing method of the depletion mode trench semiconductor device according to the first preferred embodiment of the present invention.

Figure 1:
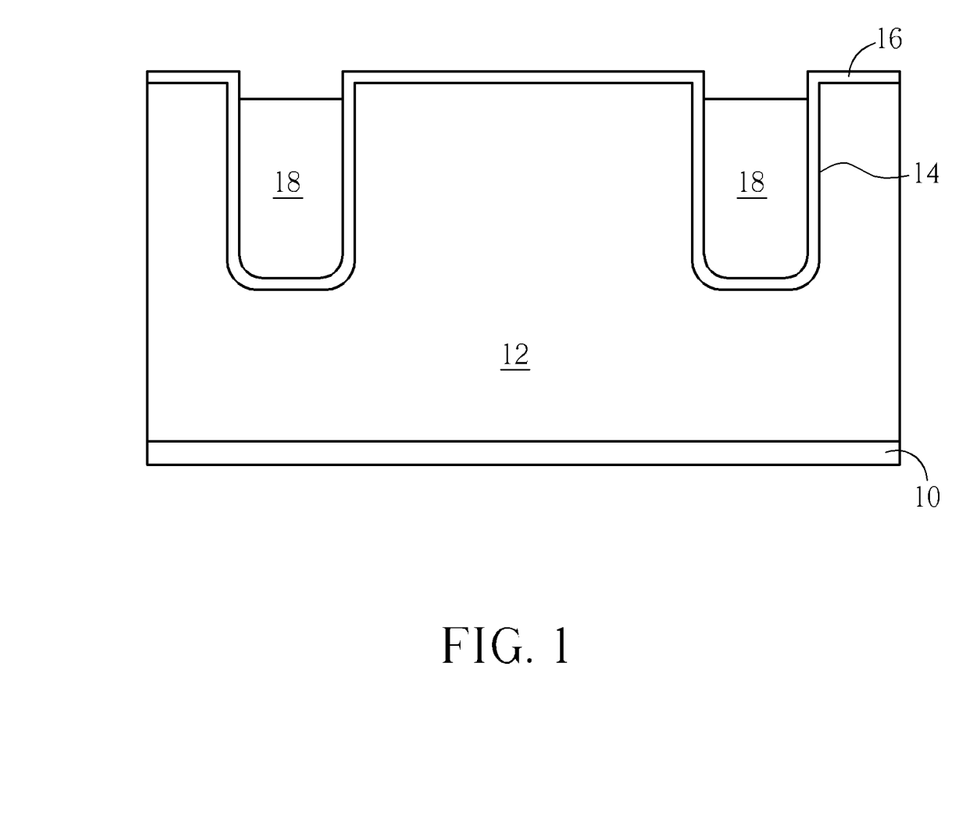
FIGS. 1-6 are schematic diagrams illustrating the manufacturing method of the depletion mode trench semiconductor device according to the first preferred embodiment of the present invention.

As shown in FIG. 1, firstly, a substrate 10 is provided. A drift epitaxial layer 12 is disposed on the substrate 10. The substrate 10 and the drift epitaxial layer 12 have a first type conductivity. The substrate 10 may be a silicon substrate such as an $N^+$-doped substrate or a $P^+$-doped substrate. The drift epitaxial layer 12 may be formed by an epitaxy process. According to a preferred embodiment of the present invention, the first type conductivity is an n-type conductivity. For example, preferably, the substrate 10 is an $N^+$-doped substrate and the drift epitaxial layer 12 is an $N^-$-doped epitaxial layer.

At least one trench 14 is then formed in the drift epitaxial layer 12. The amount of the trench 14 may be modified for different requirements from products. A gate dielectric layer 16 is entirely formed on an inner surface of the trench 14 and a surface of the drift epitaxial layer 12. The gate dielectric layer 16 may be a silicon oxide layer generated by a thermal oxidation process on the drift epitaxial layer 12. A sacrificial layer 18 is entirely formed to cover the epitaxial layer 12 and fill the trench 14. An etch-back process is then executed to remove the sacrificial layer 18 on an upper surface of the drift epitaxial layer 12 and make an upper surface of the sacrificial layer 18 in the trench 14 lower than the drift epitaxial layer 12. Preferably, the sacrificial layer 18 is photoresist or polysilicon.

Figure 2:
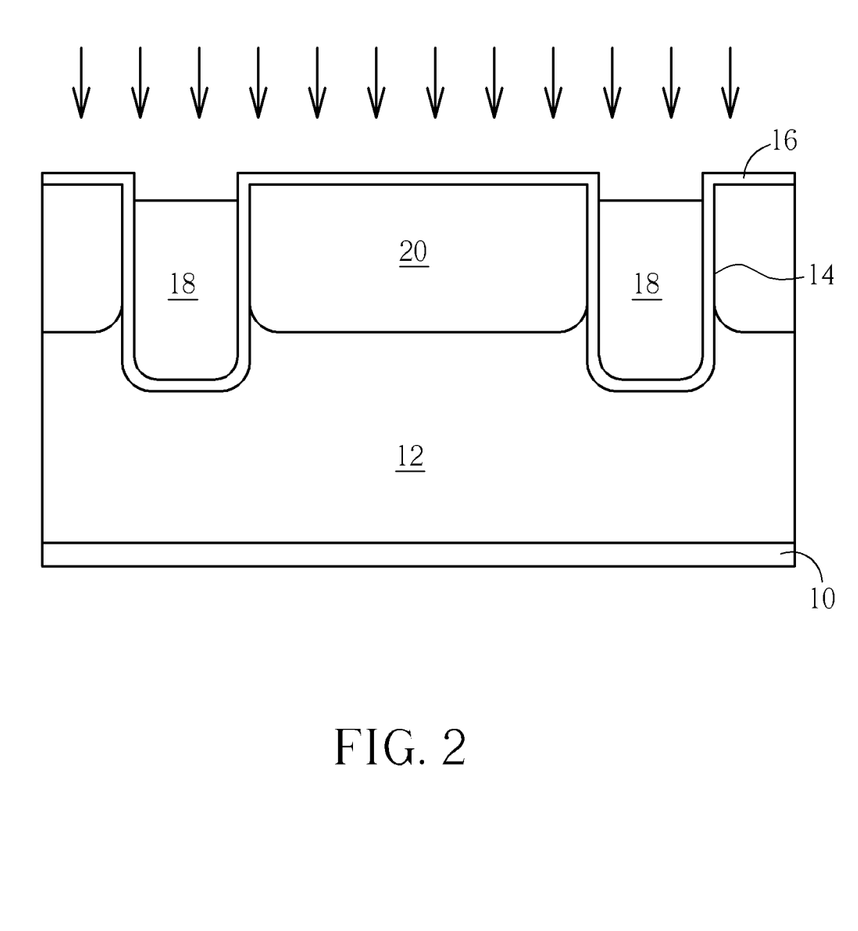

As shown in FIG. 2, an ion implantation process is executed for implanting dopants with a second type conductivity into the drift epitaxial layer 12 for forming a base doped region 20 with the second type conductivity. Then a thermal process is applied to make the base doped region 20 diffusing into a required depth. According to the preferred embodiment of the present invention, the second type conductivity is a p-type conductivity. During the process of forming the base doped region 20, the above-mentioned sacrificial layer 18 may be used as a mask for blocking the dopants and preventing the dopants from being implanted into a bottom 142 of the trench 14.

Figure 3:
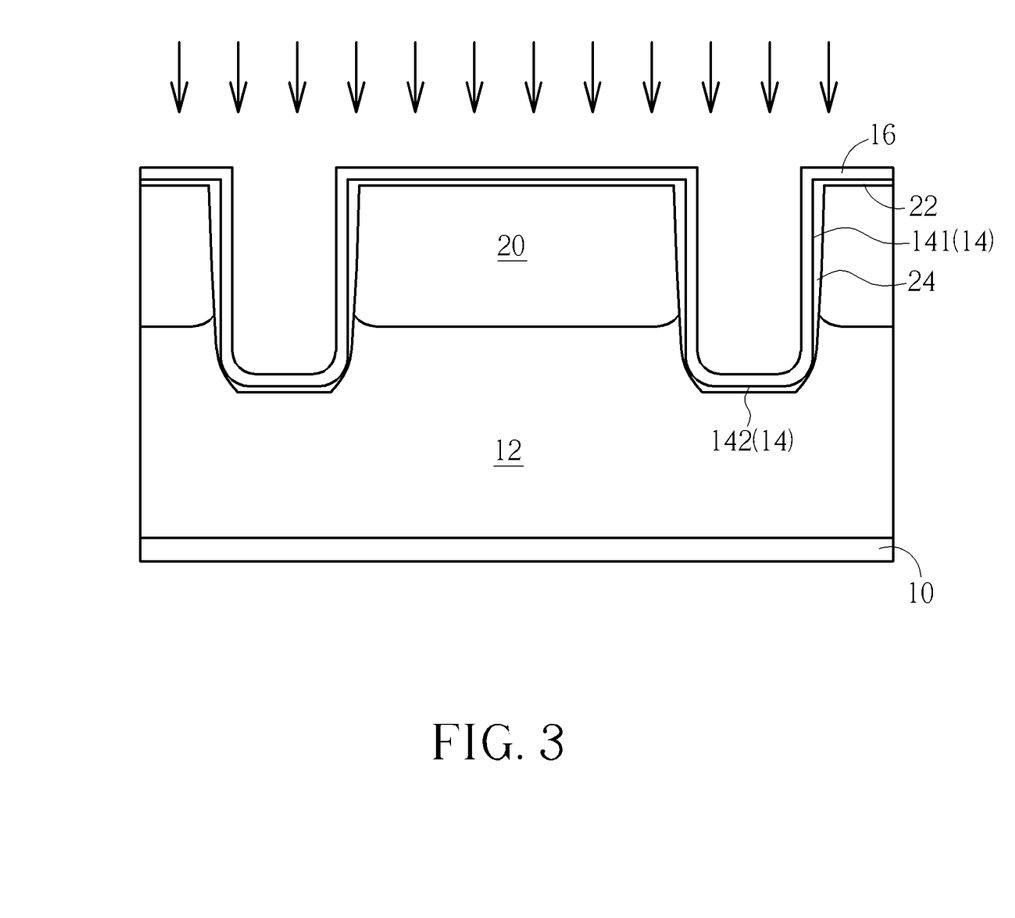

As shown in FIG. 3, the sacrificial layer 18 is removed, and the base doped region 20 is disposed in the drift epitaxial layer 12 in the sidewall of the trench 14. Although the dopants are implanted into the gate dielectric layer 16 when forming the base doped region 20, the gate dielectric layer 16 is still a nonconductor because the gate dielectric layer 16 is an insulating material layer. Therefore, regions of the gate dielectric layer 16 implanted with the dopants are not taken as a part of the base doped region 20. Subsequently, another ion implantation process is entirely executed for implanting dopants with the first type conductivity into the drift epitaxial layer 12 and the base doped region 20 for forming a thin doped region 22 conformally contacting the gate dielectric layer 16. No mask is required for forming the thin doped region 22. It is worth noticing that parts of the thin doped region 22 surround an outer sidewall 141 and the bottom 142 of the trench 14, and the thin doped region 22 surrounding the outer sidewall 141 of the trench 14 in the base doped region 20 is defined as an inversion layer 24. The rest of the thin doped region 22 such as the thin doped region 22 surrounding the outer bottom 142 and the outer sidewall 141 of the trench 14 outside the base doped region 20 is still defined as the thin doped region 22.

The thin doped region 22 is preferably formed by a tilt ion implantation process. A range of the tilted angle is between 7 degrees and 45 degrees. The thin doped region 22 has the first type conductivity.

Figure 4:
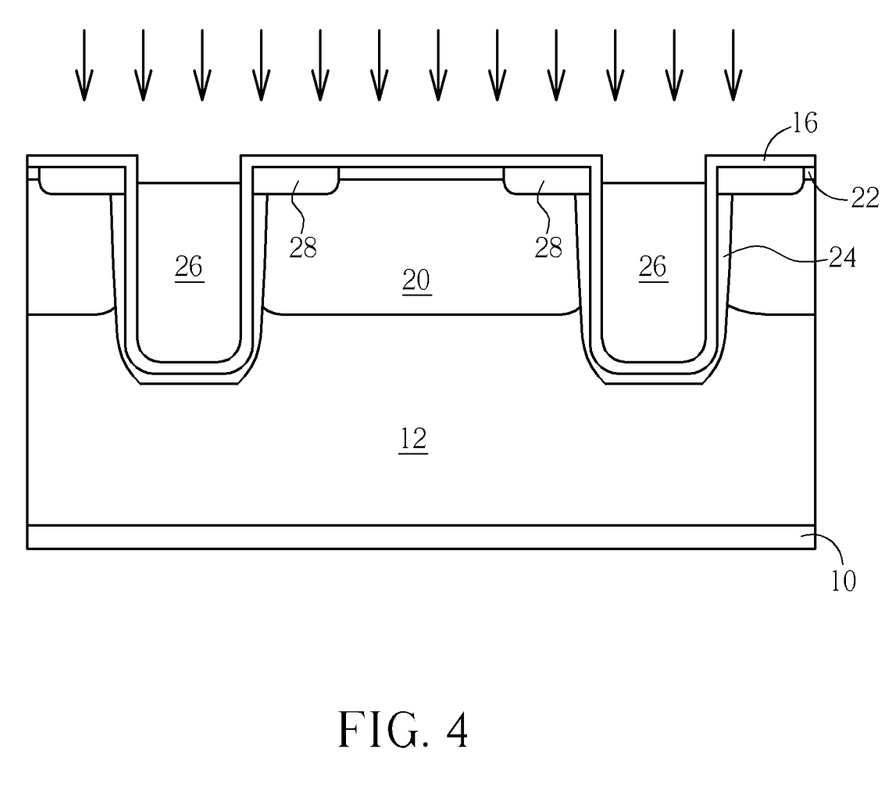

As shown in FIG. 4, a gate material layer 26 is formed in the trench 14. Preferably, the gate material layer 26 is polysilicon. An ion implantation process is then executed for forming a source doped region 28 in the base doped region 20. Preferably, the source doped region 28 is disposed on two sides of the trench 14, and the source doped region 28 partially overlaps the thin doped region 22. The source doped region has the first type conductivity, i.e. the source doped region 28 is preferably an N+ source doped region. Then a thermal process is applied to diffuse the source doped region 28, and the thermal process also makes the inversion layer 24 diffusing into a predetermined thickness.

Figure 5:
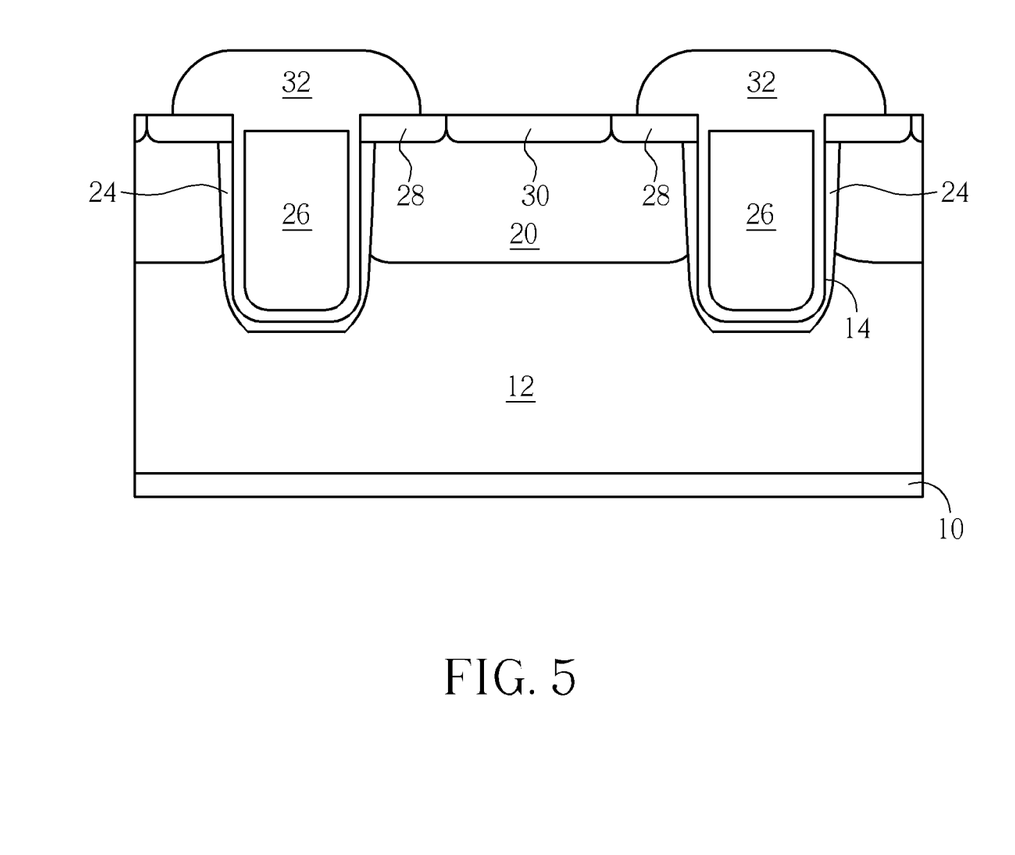

As shown in FIG. 5, a dielectric layer 32 is entirely formed to cover the gate material layer 26 and the gate dielectric layer 16. The dielectric layer 32 is then patterned for reserving the dielectric layer 32 disposed on the gate material layer 26 and a part of the dielectric layer 32 disposed on the source doped region 28, and for exposing the base doped region 20. Subsequently, a contact doped region 30 is formed to be adjacent and contact the source doped region 28. An upper surface of the source doped region 28 and an upper surface of the contact doped region 30 are aligned at a same level. The contact doped region 30 preferably has the second type conductivity.

Figure 6:
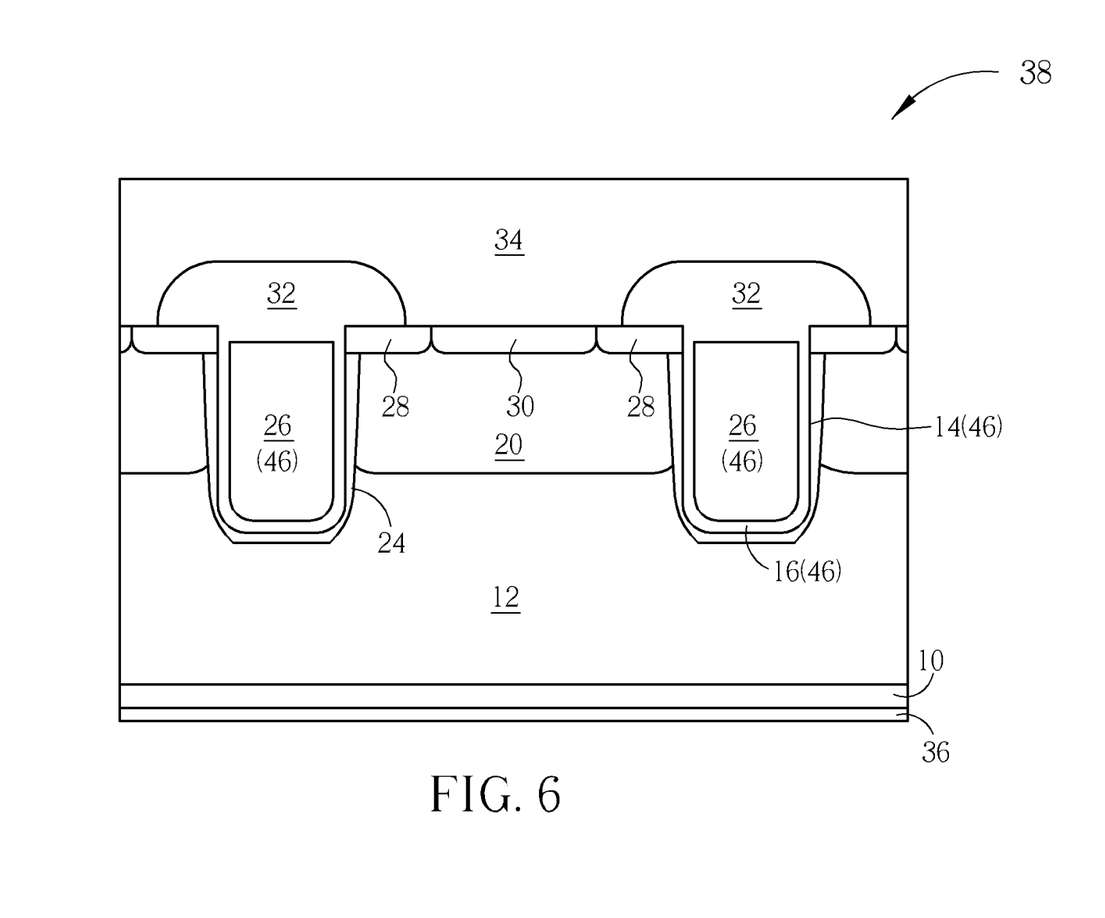

As shown in FIG. 6, a source conductive line 34 and a drain conductive line 36 are formed, and the source conductive line 34 contacts the source doped region 28, the contact doped region 30 and the dielectric layer 32 for completing a depletion mode trench semiconductor device 38 of the first preferred embodiment of the present invention. The source conductive line 34 are electrically connected to the source doped region 28 and the contact doped region 30 for making an electrical potential of the source doped region 28 equal to an electrical potential of the contact doped region 30. The drain conductive line 36 covers another surface of the substrate 10 opposite to the drift epitaxial layer 12, i.e. the substrate 10 is disposed between the drain conductive line 36 and the drift epitaxial layer 12. The source conductive line 34 and the drain conductive line 36 may be made of aluminum, copper, tungsten, or silver, but the present invention is not limited to this. Other conductive materials may be applied depending on different process requirements and specifications of products. In this embodiment, a preferred material of the source conductive line 34 and the drain conductive line 36 is aluminum. The manufacturing method of the source conductive line 34 is compatible for the semiconductor device with lower integrated density.

Figure 7:
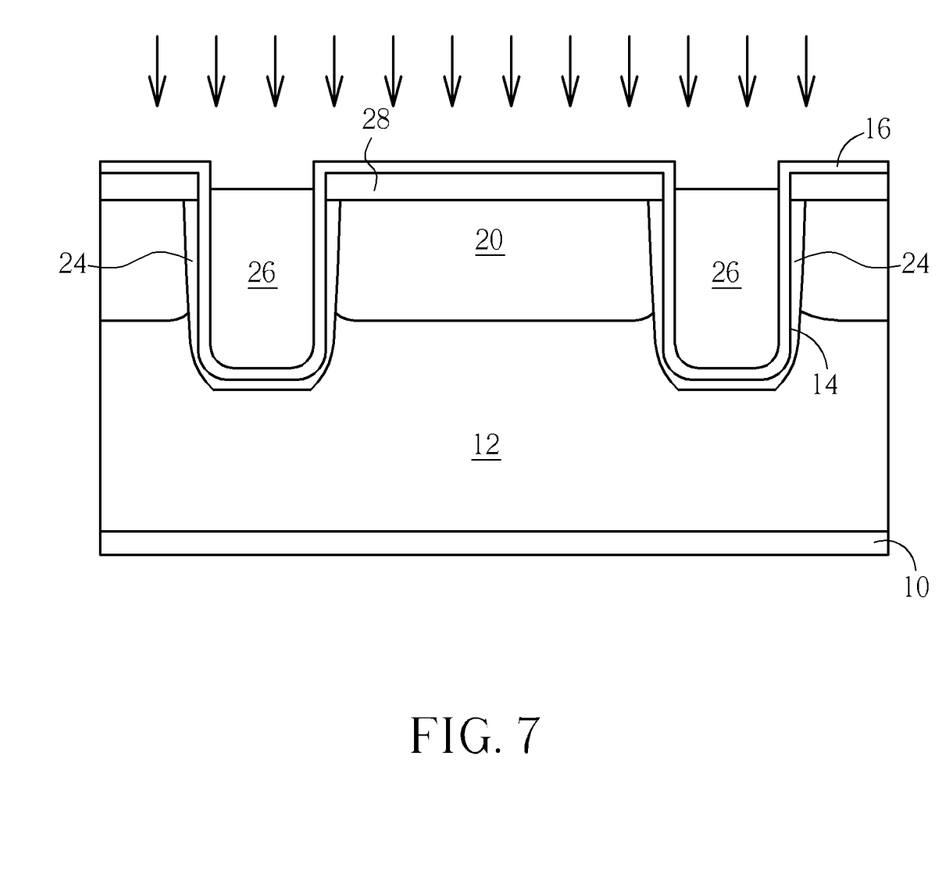
FIGS. 7-9 are schematic diagrams illustrating the manufacturing method of the depletion mode trench semiconductor device according to the second preferred embodiment of the present invention.
Figure 8:
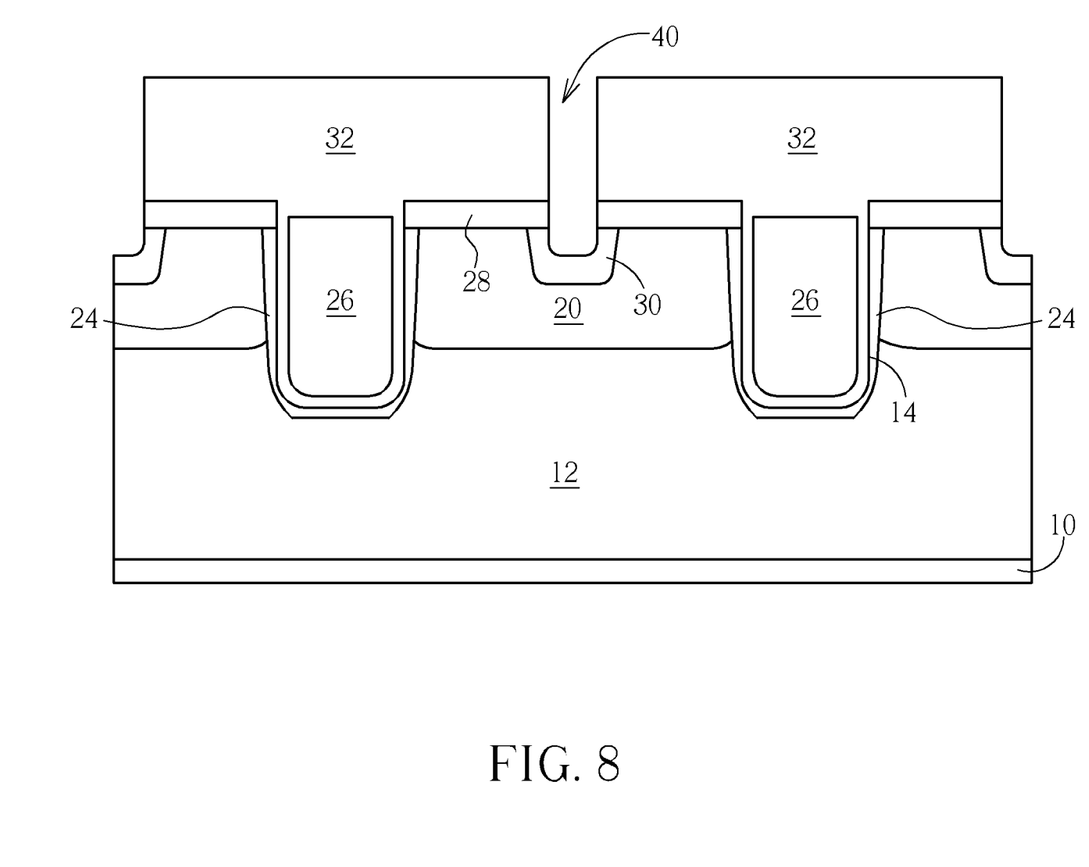
Figure 9:
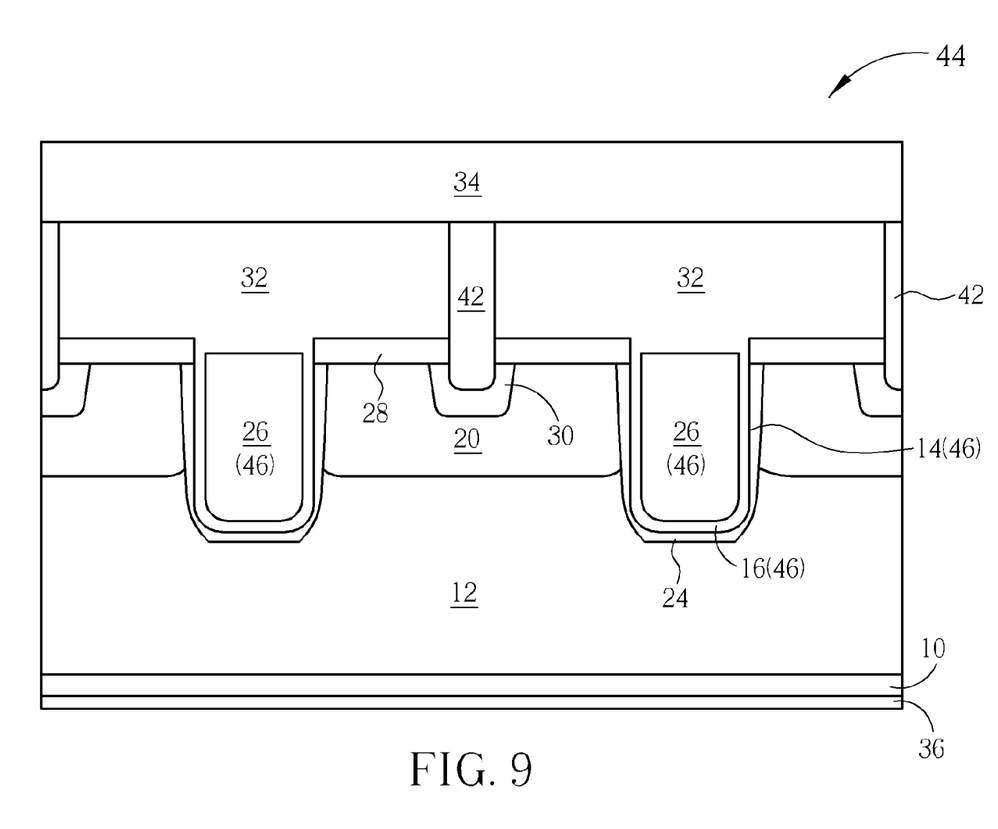

According to a second preferred embodiment of the present invention, the manufacturing method of the depletion mode trench semiconductor device may be compatible for semiconductor devices with higher integrated density after modifying positions of the contact doped region and the source conductive line. FIGS. 7-9 are schematic diagrams illustrating the manufacturing method of the depletion mode trench semiconductor device according to the second preferred embodiment of the present invention, wherein identical components are marked with the same reference numerals. After forming the above-mentioned inversion layer in FIG. 3, a gate material layer 26 is formed to fill the trench 14, as shown in FIG. 7. A source doped region 28 is then formed by an implantation process. The source doped region 28 is adjacent to an upper surface of the base doped region 20 and partially overlaps the inversion layer 24.

As shown in FIG. 8, a dielectric layer 32 is formed to cover the gate material layer 26 and the gate dielectric layer 16. A contact hole 40 is then formed to penetrate the dielectric layer 32 and the source doped region 28 and expose the base doped region 20 under the source doped region 28. An ion implantation process is then executed to form a contact doped region 30 in the base doped region 20 under the source doped region 28. The contact doped region 30 has the second type conductivity.

As shown in FIG. 9, a contact plug 42 is formed to fill the contact hole 40. The contact plug 42 is electrically connected to both the source doped region 28 and the contact doped region 30 for making the electrical potential of the source doped region 28 equal to the electrical potential of the contact doped region 30. Subsequently, a source conductive line 34 and a drain conductive line 36 are formed. The source conductive line 34 covers the dielectric layer 32 and the contact plug 42, and the drain conductive line 36 covers another side of the substrate 10 opposite to the epitaxial layer 12. A depletion mode trench semiconductor device 44 in the first preferred embodiment of the present invention is then completed.

According to a third preferred embodiment of the present invention, a depletion mode trench semiconductor device is provided. As shown in FIG. 6, a depletion mode trench semiconductor device 38 includes a substrate 10, a drift epitaxial layer 12 disposed on the substrate 10, and a base doped region 20 disposed in the drift epitaxial layer 12. The substrate 10 has a first type conductivity, and the epitaxial layer 12 also has the first type conductivity. The base doped region 20 has a second type conductivity. According to a preferred embodiment of the present invention, the first type conductivity is an n-type conductivity and the second type conductivity is a p-type conductivity. For example, the substrate 10 is preferably an $N^+$-doped substrate and the drift epitaxial layer 12 is preferably an $N^-$-doped epitaxial layer. The base doped region 20 is a region mainly doped with p-type dopants. Additionally, the depletion mode trench semiconductor device 38 further includes a trench gate structure 46 disposed in the epitaxial layer 12 and disposed on a side of the base doped region 20. The trench gate structure 46 includes a trench 14, a gate dielectric layer 16, and a gate material layer 26. The trench 14 is disposed in the epitaxial layer 12, the gate dielectric layer 16 is disposed on an inner sidewall of the trench 14, and the gate material layer 26 fill the trench 14. The amount of the trench gate structure 46 may be modified for different requirements from products. If there are two or more trench gate structures 46, the base doped region 20 will be disposed in the epitaxial layer 20 between two trench gate structures 46. A source doped region 28 having the first type conductivity is disposed in the base doped region 20. The source doped region 28 is adjacent to the trench gate structure 46 and contacts the trench gate structure 46. The gate material layer 26 may be polysilicon, and the gate dielectric layer 16 may be silicon oxide. A contact doped region 30 having the second type conductivity is disposed in the base doped region 20. The contact doped region 30 is adjacent to the source doped region 28 and contacts the source doped region 28. An upper surface of the contact doped region 30 and an upper surface of the source doped region 28 are kept in a same level. It is worth noticing that an inversion layer 24 having the first type conductivity is disposed in the base doped region 20 and partially contacts the sidewall of the trench gate structure 46. In addition, a thin doped region 22 is disposed in the epitaxial layer 12 and contacts the trench gate structure 46. A dielectric layer 32 covers the trench gate structure 46 and partially covers the source doped region 28. A source conductive line 34 covers the trench gate structure 46. The source conductive line 34 contacts the source doped region 28 and the contact doped region 30, and the source conductive line 34 is electrically connected to the source doped region 28 and the contact doped region 30. A drain conductive line 36 covers a surface of the substrate 10 opposite to the epitaxial layer 12. The source conductive line 34 and the drain conductive line 36 may be made of aluminum, copper, tungsten, or silver, but the present invention is not limited to this. The structure of the depletion mode trench semiconductor device in the third preferred embodiment is more suitable for semiconductor devices with lower integrated density.

According to the fourth preferred embodiment of the present invention, another depletion mode trench semiconductor device is provided. In the fourth preferred embodiment, the points different from the third preferred embodiment include that a source conductive line is electrically connected to a source doped region and a contact doped region via a contact plug, and a relative position between the source doped region and the contact doped region is modified. The following description will detail the dissimilarities among the third preferred embodiment and the fourth preferred embodiment. The other components will not be redundantly described. As shown in FIG. 9, a source doped region 28 and a contact doped region 30 of a depletion mode trench semiconductor device 44 are disposed in a base doped region 20. The contact doped region 30 is disposed under the source doped region 28. A dielectric layer 32 covers a trench gate structure 46 and the source doped region 28. Additionally, a contact hole 40 penetrates the dielectric layer 32 and the source doped region 28 for reaching the contact doped region 30. A contact plug 42 is disposed in the contact hole 40. A source conductive line 34 is disposed on the dielectric layer 32 and contacts the contact plug 40. The structure of the depletion mode trench semiconductor device in the third preferred embodiment is more suitable for semiconductor devices with higher integrated density.

In the depletion mode trench semiconductor device of the present invention, the trench gate structure is employed for manufacturing the depletion mode semiconductor, and the feature is that an inversion layer is disposed on the sidewall of the trench gate structure and the inversion layer may be used to prevent the punch through effect from being generated in the depletion mode semiconductor devices. Additionally, the base doped region of the depletion mode trench semiconductor may not be effected by over diffusion, which may be generated by thermal processes for the gate dielectric layer, because the base doped region is formed after the gate dielectric layer. Moreover, the inversion layer may be controlled within a specific thinner thickness, because the inversion layer is diffused only by the thermal diffusion process of the source doped region.

Those skilled in the art will readily observe that numerous modifications and alterations of the device and method may be made while retaining the teachings of the invention.

What is claimed is:
1. A depletion mode trench semiconductor device, comprising:
   a substrate having a first type conductivity;
   a drift epitaxial layer having the first type conductivity, wherein the drift epitaxial layer is disposed on the substrate;
   a base doped region having a second type conductivity, wherein the base doped region is disposed in the drift epitaxial layer;
   a trench gate structure, disposed in a trench extending into the drift epitaxial layer and on a side of the base doped region, wherein the trench comprises a horizontal, flat bottom surface and a vertical outer sidewall;
   a source doped region having the first type conductivity, wherein the source doped region is disposed in the base doped region and adjacent to the trench gate structure;
   a contact doped region having the second type conductivity, wherein the contact doped region is disposed in the base doped region and adjacent to the source doped region;
   an inversion layer having the first type conductivity, wherein the inversion layer is disposed outside of the trench in the base doped region and the inversion layer encompasses the vertical outer sidewall of the trench;
   a diffused region of the first conductivity type in the drift epitaxial layer, wherein the diffused region encompasses the horizontal, flat bottom surface of the trench and extends to the vertical outer sidewall of the trench to merge with the inversion layer;
   a dielectric layer covering the trench gate structure; and
   a source conductive line electrically connecting with the source doped region and the contact doped region.

2. The depletion mode trench semiconductor device of claim 1, wherein the first type conductivity is n-type and the second type conductivity is p-type.

3. The depletion mode trench semiconductor device of claim 1, wherein the trench gate structure comprises:
   a trench disposed in the drift epitaxial layer;
   a gate dielectric layer disposed on an inner sidewall of the trench; and
   a gate material layer filling the trench.

4. The depletion mode trench semiconductor device of claim 1, further comprising a drain conductive line covering a surface of the substrate opposite to the drift epitaxial layer.

5. The depletion mode trench semiconductor device of claim 1, wherein the dielectric layer covers the source doped region and the contact doped region.

6. The depletion mode trench semiconductor device of claim 5, further comprising a contact plug disposed in the dielectric layer, wherein the contact plug contacts the source doped region and the contact doped region.

7. The depletion mode trench semiconductor device of claim 6, wherein the source doped region is disposed on the contact doped region.

8. The depletion mode trench semiconductor device of claim 6, wherein the source conductive line is disposed on the dielectric layer and contacts the contact plug.

9. The depletion mode trench semiconductor device of claim 1, wherein the source conductive line is disposed on the dielectric layer and contacts the source doped region and the contact doped region.

10. The depletion mode trench semiconductor device of claim 9, wherein an upper surface of the source doped region is aligned with an upper surface of the contact doped region.

* * * * *